United States Patent
Shikata

[11] Patent Number: 5,825,252
[45] Date of Patent: Oct. 20, 1998

[54] SYNTHESIZED OSCILLATION CIRCUIT

[75] Inventor: Makoto Shikata, Tokyo, Japan

[73] Assignee: Oki Electric Industry Co., Ltd., Tokyo, Japan

[21] Appl. No.: 806,988

[22] Filed: Feb. 26, 1997

[30] Foreign Application Priority Data

Mar. 11, 1996 [JP] Japan .................................. 8-052903

[51] Int. Cl.$^6$ .................................................. H03L 7/00
[52] U.S. Cl. .............................. 331/1 R; 331/18; 331/25; 331/43
[58] Field of Search ............................ 331/1, 2, 25, 18, 331/59, 182, 43; 375/1

[56] References Cited

U.S. PATENT DOCUMENTS

| | | |
|---|---|---|
| 3,949,314 | 4/1976 | Machida . |
| 4,472,817 | 9/1984 | Poklemba et al. . |
| 4,570,125 | 2/1986 | Gibson . |
| 4,648,060 | 3/1987 | Allen ........................................... 331/2 |
| 4,817,197 | 3/1989 | Shimizu et al. . |
| 5,301,206 | 4/1994 | Ishigaki et al. ............................. 375/1 |
| 5,414,736 | 5/1995 | Hasegawa et al. .................. 331/179 X |
| 5,654,574 | 8/1997 | Matsuto ................................... 331/1 R |
| 5,661,439 | 8/1997 | Watkins et al. .......................... 331/1 R |

*Primary Examiner*—Huang Hoang
*Attorney, Agent, or Firm*—Spencer & Frank

[57] ABSTRACT

A synthesized oscillation circuit that can relax a limitation of the maximum operational frequency. A mixer (MX), a bandpass filter (BPF), an amplitude limiting amplifier (LIM), a phase detector (PD), a low-pass filter (LPF), and a voltage-controlled oscillator (VCO) are serially connected between a signal input terminal (IN) and a signal output terminal (OUT). The signal output terminal (OUT) is connected the mixer (MX) and the phase detector (PD). The bandpass filter (BPF) has a filtering characteristic which blocks the sum frequency component of the frequency component of an input signal from the signal input terminal (IN) to the mixer (MX) and the frequency component of an output signal from the voltage-controlled oscillator (VCO) to the mixer (MX), but which passes the difference frequency component between them. The low-pass filter (LPF) has a filtering characteristic which blocks the sum frequency component of the frequency component of a signal from the voltage-controlled oscillator (VCO) to the phase detector (PD) and the frequency component of a signal from the voltage-controlled oscillator (VCO) to the phase detector (PD), but which passes the difference frequency signal between them.

18 Claims, 3 Drawing Sheets

SYNTHESIZED OSCILLATION CIRCUIT

BACKGROUND OF THE INVENTION

1. Field of the Invention

The present invention relates to a synthesized oscillation circuit.

2. Description of the Related Art

Conventionally, there have been synthesized oscillation circuits of the type which receive an amplitude-modulated input signal and then output an output signal of half of the frequency of the input signal. Usually, the synthesized oscillation circuit is formed of an amplitude limiting amplifier, a mixer, a low-pass filter, and a voltage-controlled oscillator, which are serially connected between a signal input terminal and a signal output terminal, and a frequency multiplier. The frequency multiplier has an input terminal connected to the signal output terminal and an output terminal connected to the LO input terminal of the mixer.

Where the input signal is amplitude-modulated, the output frequency of the voltage-controlled oscillator would be influenced by the amplitude modulation in the absence of the amplitude limiting amplifier. For that reason, the conventional synthesized oscillation circuit includes the amplitude limiting amplifier, which removes amplitude-modulation from the input signal.

However, in the conventional synthesized oscillation circuit, its maximum operational frequency is limited by the amplitude limiting amplifier. When the input signal has, for example, a high frequency of about 10 GHz, a high-performance amplitude limiting amplifier which has a frequency as high as the frequency of an input signal must be used.

Moreover, the frequency multiplier in the conventional synthesized oscillation circuit loses electric power. For example, where an input signal of about 10 GHz is input, the frequency multiplier decreases its output power to less than 1/10. In order to compensate for the power loss, it is needed to increase the electric power of the output signal from the voltage-controlled oscillator to be input to the frequency multiplier. As a result, the problem is that the total power consumption of the synthesized oscillation circuit increases.

The object of the invention is to provide a synthesized oscillation circuit in which the limit of the maximum operational frequency is relieved and the power consumption is reduced.

SUMMARY OF THE INVENTION

According to a first aspect of the present invention, a synthesized oscillation circuit having the following features is provided.

That is, the synthesized oscillation circuit comprises a signal input terminal, a signal output terminal, a mixer, a first filter, an amplitude limiting amplifier, a phase detector, a second filer, and a voltage controlled oscillator.

The signal input terminal is connected to the RF terminal of the mixer. The IF terminal of the mixer is connected to the input terminal of the first filter. The output terminal of the first filter is connected to the input terminal of the amplitude limiting amplifier. The output terminal of the amplitude limiting amplifier is connected to the input terminal of the phase detector. The output terminal of the phase detector is connected to the input terminal of the second filter. The output terminal of the second filter is connected to the input terminal of the voltage-controlled oscillator. The output terminal of the voltage-controlled oscillator is connected to the signal output terminal, the LO terminal of the mixer, and the other input terminal of the phase detector.

The first filter has a filtering characteristic which blocks the sum frequency component of the frequency component of a signal from the signal input terminal to the mixer and the frequency component of a signal from the voltage-controlled oscillator to the mixer but passes the difference component between them.

The second filter has a filtering characteristic which blocks the sum frequency component of the frequency component of a signal from the amplitude limiting amplifier to the phase detector and the frequency component of a signal from the voltage-controlled oscillator to the phase detector but passes the difference component between them.

The first filter is formed as a bandpass filter. The second filter is formed as a low-pass filter.

With such an arrangement of the above-mentioned first synthesized oscillation circuit, the maximum operational frequency required for the amplitude limiting amplifier can be sufficiently set to half of the frequency of an input signal. Furthermore, the circuit does not use any frequency multiplier, so that there will be no fear to lose electric power due to the frequency multiplier, thus reducing the whole electric power consumption of the circuit.

According to a second aspect of the present invention, a synthesized oscillation circuit having the following features is provided.

That is, the synthesized oscillation circuit comprises a signal input terminal, a signal output terminal, a phase detector, a filter, and an amplitude limiting amplifier.

The signal input terminal is connected to the input terminal of the phase detector. The output terminal of the phase detector is connected to the input terminal of the filter. The output terminal of the filter is connected to the input terminal of the amplitude limiting amplifier. The amplitude limiting amplifier is connected to the signal output terminal and the other input terminal of the phase detector.

The filter has a filtering characteristic which blocks the sum frequency component of the frequency component of a signal from the signal input terminal to the phase detector and the frequency component of a signal from the amplitude limiting amplifier to the phase detector but passes the difference frequency component between them.

The filter is formed as a bandpass filter or as a low-pass filter.

With such an arrangement of the above-mentioned second synthesized oscillation circuit, the maximum operational frequency required for the amplitude limiting amplifier can be set to half of the frequency of an input signal. Furthermore, the second circuit does not use a frequency multiplier and a voltage-controlled oscillator, so that the whole electric power consumed by the second circuit can be reduced.

The above and other objects, features and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Embodiments of a synthesized oscillation circuit according to the present invention will be described below with reference to the attached drawings.

(Comparison Example)

Figure 3:
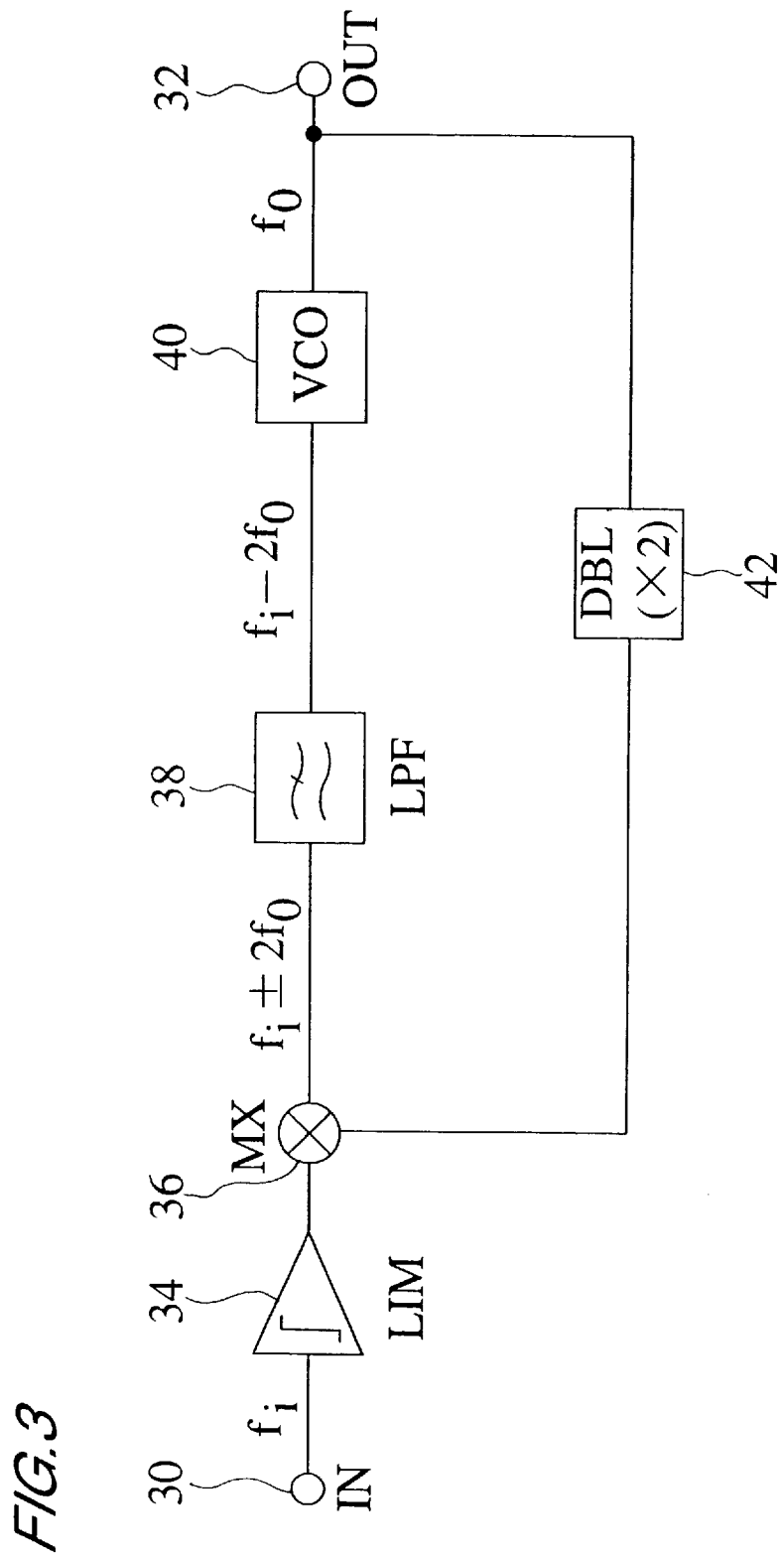
FIG. 3 is a block circuit diagram used for explaining a synthesized oscillation circuit shown as a comparison example.

Preceding an explanation of the embodiments according to the present invention, a conventional synthesized oscillation circuit will be explained as a comparison example to facilitate an understanding of this invention. FIG. 3 is a block circuit diagram used for explaining the comparison example of a synthesized oscillation circuit.

In the comparison example, a synthesized oscillation circuit includes a signal input terminal (IN) 30, an amplitude limiting amplifier (LIM) 34 having its input terminal connected the signal input terminal (IN) 30, a mixer (MX) 36 having its RF terminal connected to the output terminal of the amplitude limiting amplifier (LIM) 34, a low-pass filter (LPF) 38 having its input terminal connected to the IF terminal of the mixer (MX) 36, a voltage-controlled oscillator (VCO) 40 having its input terminal connected to the output terminal of the low-pass filter (LPF) 38, and a signal output terminal (OUT) 32 connected to the output terminal of the voltage-controlled oscillator (VCO), and a frequency multiplier (DBL) 42. The frequency multiplier 42 has an input terminal connected to the signal output terminal 32 and an output terminal connected to the LO input terminal of the mixer 36.

The operation of the comparison example will be explained below, assuming that an input signal of a frequency $f_i$ is input from the signal input terminal (IN) 30 and an output signal of a frequency $f_o$ from the voltage-controlled oscillator (VCO) 40 is output from the signal output terminal (OUT) 32.

First, the amplitude limiting amplifier (LIM) 34 receives an input signal of a frequency $f_i$ via the signal input terminal (IN) 30 and then removes the amplitude-modulation components. Then the resultant signal is input to the RF input terminal of the mixer (MX) 36. On the other hand, the frequency multiplier (DBL) 42 receives an output signal from the voltage-controlled oscillator (VCO) 40 and then outputs a multiplied signal of a frequency $2f_o$ —(twice the frequency of the output signal) to the LO terminal of the mixer (MX) 36. A sum frequency component (of a frequency $(f_i+2f_o)$) of the frequency component of the input signal and the frequency component of the multiplied signal, as well as a difference frequency component (of a frequency $(f_i-2f_o)$) between them, are output from the mixer (MX) 36 and then supplied to the low-pass filter (LPF) 38. The low-pass filter (LPF) 38 passes only the difference frequency component (of a frequency $(f_i-2f_o)$) and then inputs it to the voltage-controlled oscillator 40. In a steady state, the input signal of the voltage-controlled oscillator (VCO) 40 becomes a dc, that is, $(f_i-2f_o)=0$ (Hz). Hence, the frequency $f_o$ of an output signal corresponds to ½ of the frequency $f_i$ of an input signal.

In the synthesized oscillation circuit shown in the comparison example, the operational frequency of the amplitude limiting amplifier (LIM) 34 corresponds to the upper limit of the operational frequency of the synthesized oscillation circuit, that is, the maximum frequency of an input signal to the synthesized oscillation circuit.

(First Embodiment)

Figure 1:
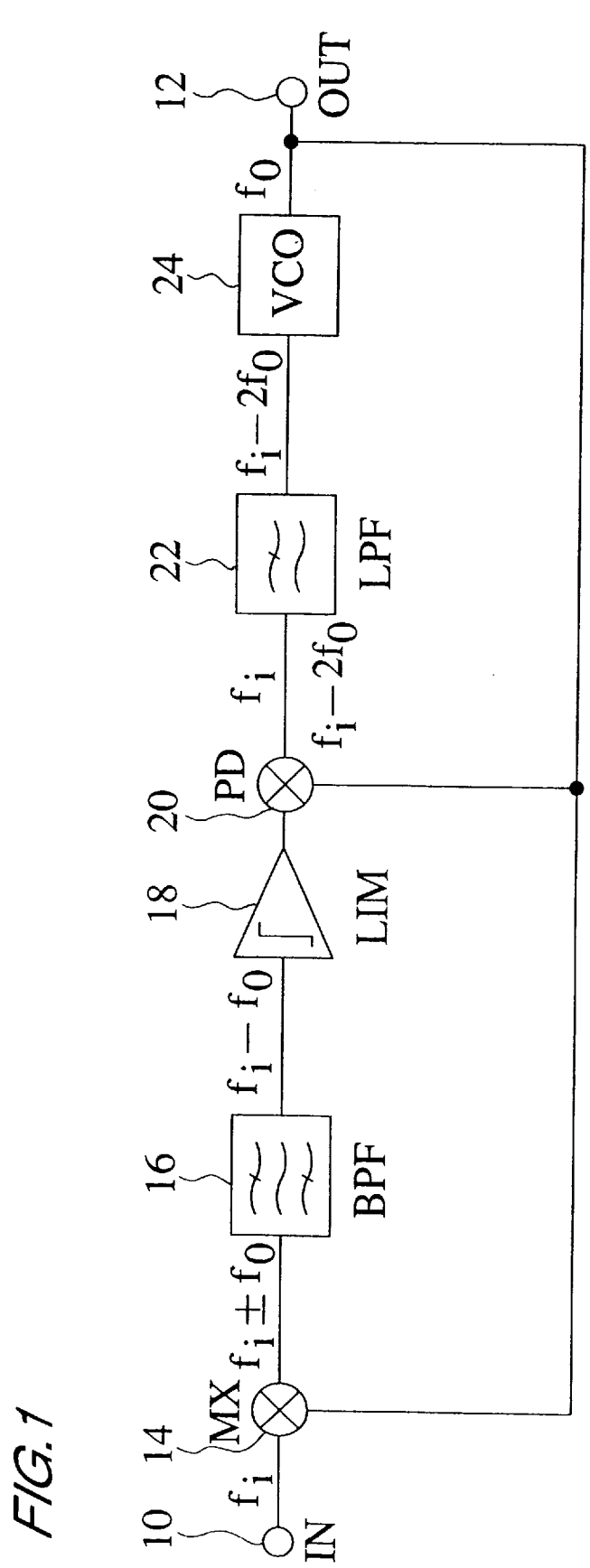
FIG. 1 is a block circuit diagram used for explaining a synthesized oscillation circuit according to a first embodiment of the present invention.

In the first embodiment, an example of a synthesized oscillation circuit according to the present invention will be explained below. FIG. 1 is a block circuit diagram used for explaining the synthesized oscillation circuit according to the first embodiment.

According to the present invention, the synthesized oscillation circuit includes a signal input terminal (IN) 10, a signal output terminal (OUT) 12, a mixer (MX) 14, a bandpass filter (BPF) 16 acting as a first filter, an amplitude limiting amplifier (LIM) 18, a phase detector (PD) 20, a low-pass filter (LPF) 22 acting as a second filter, and a voltage-controlled oscillator (VCO) 24.

The signal input terminal 10 is connected to the RF input terminal of the mixer (MX) 14. The IF output terminal of the mixer 14 is connected to the input terminal of the bandpass filter 16. The output terminal of the bandpass filter 16 is connected to the input terminal of the amplitude limiting amplifier 18. The output terminal of the amplitude limiting amplifier 18 is connected to one input terminal of the phase detector 20. The output terminal of the phase detector 20 is connected to the input terminal of the low-pass filter 22. The output terminal of the low-pass filter 22 is connected to the input terminal of the voltage-controlled oscillator 24. The output terminal of the voltage-controlled oscillator 24 is connected to the signal output terminal 12, the LO input terminal of the mixer 14, and the other input terminal of the phase detector 20.

Next, an explanation will be presented below as for the case where an input signal of a frequency $f_i$ is input from the signal input terminal 10 and where an output signal of a frequency $f_o$ from the voltage-controlled oscillator 24 is output from the signal output terminal 12. The input signal usually contains amplitude-modulated frequency components.

First, the input signal from the signal input terminal 10 is input to the RF input terminal of the mixer 14. The output signal (of a frequency $f_o$) from the voltage-controlled oscillator 24 is input to the LO input terminal of the mixer 14. The mixer (MX) 14 produces a sum frequency component (of a frequency $(f_i+f_o)$) of the frequency component of the input signal and the frequency component of the output signal as well as the difference frequency signal (of a frequency $(f_i-f_o)$) between them.

Next, the sum frequency component and the difference frequency component are input to the bandpass filter 16. The bandpass filter 16 has a filtering characteristic which blocks the sum frequency component but passes the difference frequency component. Hence, the bandpass filter 16 passes the difference frequency component (of a frequency $(f_i-f_o)$).

Next, the amplitude limiting amplifier 18 receives the difference frequency component and then outputs the difference frequency component in which amplitude-modulated frequency components have been removed.

The difference frequency component is input to one input terminal of the phase detector 20. The output signal (of a frequency $f_o$) from the voltage-controlled oscillator 24 is input to the other input terminal of the phase detector 20. The phase detector 20 outputs the sum frequency component (of a frequency $(f_i-f_o+f_o=f_i)$) of the difference frequency component (of a frequency $f_i-f_o$) and the output signal (of a frequency $f_o$) as well as the difference frequency component (of a frequency $(f_i-f_o-f_o=f_i-2f_o)$) between the difference frequency component (of a frequency $f_i-f_o$) and the output signal (of a frequency $f_o$). Hereinafter, to distinguish the sum frequency component and the difference frequency component which are output from the mixer 14, the sum frequency component output from the phase detector 20 will be referred to as a second sum frequency component while the difference frequency component output from the phase detector 20 will be referred to as a second difference frequency component.

Next, both the second sum frequency component and the second difference frequency component are input to the low-pass filter 22. The low-pass filter 22 has a filtering characteristic which blocks the second sum frequency component but passes the second difference frequency component. For that reason, the low-pass filter 22 outputs the second difference frequency component of two frequency components. The low-pass filter 22 can also pass dc components.

Next, the second difference frequency component (of a frequency $(f_i-2f_o)$) is input to the voltage-controlled oscillator 24. The voltage-controlled oscillator 24 outputs an output signal of a frequency $f_o$ according to the voltage of the second difference frequency component.

The second difference frequency component should be formed of only the dc component in a steady state, that is, $(f_i-2f_o)=0$. The voltage-controlled oscillator 24 is therefore set to be locked to a voltage at which the difference frequency component includes only the dc component. The frequency of the output signal output from the signal output terminal 12 in a steady state becomes the frequency of $f_i/2$ (corresponding to half of the frequency of an input signal).

Since $f_o=f_i/2$ in a steady state, the frequency of the difference frequency component input to the amplitude limiting amplifier 18 is expressed by $(f_i-f_o)=(f_i-(f_i/2))=f_i/2$. This indicates that the maximum operational frequency required for the amplitude limiting amplifier 18 can be effectively set to half of the frequency of an input signal. As a result, the limit to the maximum operational frequency can be relaxed. Hence, if an amplitude limiting amplifier which has the same maximum operational frequency as that of the conventional amplitude limiting amplifier is used, the maximum frequency of the input signal can be doubled, in comparison with the conventional maximum operational frequency. Moreover, where an input signal of the same frequency as that conventionally used is input, the amplitude limiting amplifier (which has an operational frequency of half of the frequency of an input signal) can serve sufficiently. Hence, a low-performance amplitude limiting amplifier can be used.

In the present embodiment, no frequency multiplier (DBL) is used, so that no electric power is lost due to a frequency multiplier. As a result, the electric power of the output signal from the voltage-controlled oscillator need not be increased to compensate for a power loss. This feature enables the overall electric power consumption of the synthesized oscillation circuit to be reduced.

In order to amplify the voltage of the second difference frequency component that is input to the voltage-controlled oscillator, a voltage amplifier can be arranged between the low-pass filter and the voltage-controlled oscillator.

(Second Embodiment)

Figure 2:
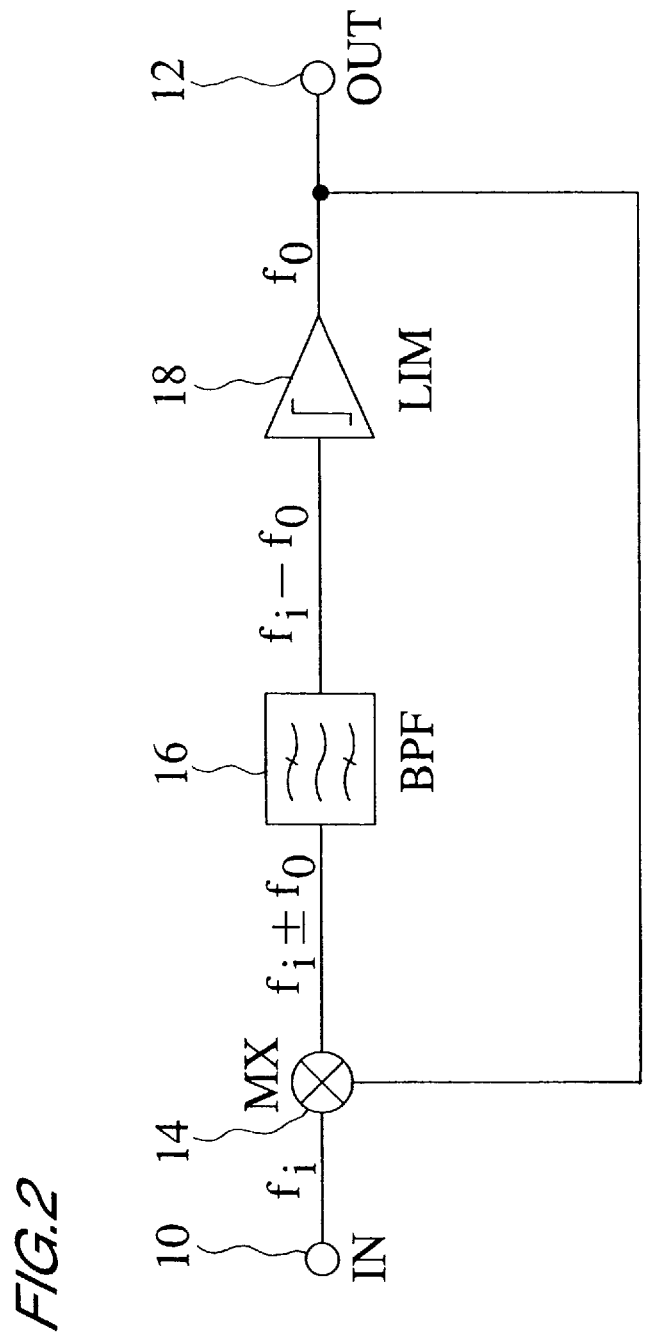
FIG. 2 is a block circuit diagram used for explaining a synthesized oscillation circuit according to a second embodiment of the present invention.

The second embodiment of a synthesized oscillation circuit according to the present invention will be explained below. FIG. 2 is a block circuit diagram used for explaining the synthesized oscillation circuit according to the second embodiment.

According to the second embodiment, a synthesized oscillation circuit includes a signal input terminal (IN) 10, a signal output terminal (OUT) 12, a mixer (MX) 14, a bandpass filter (BPF) 16, and an amplitude limiting amplifier (LIM) 18.

The signal input terminal 10 is connected to the RF input terminal of the mixer (MX) 14. The IF output terminal of the mixer 14 is connected to the bandpass filter 16. The output terminal of the bandpass filter 16 is connected to the input terminal of the amplitude limiting amplifier 18. The output terminal of the amplitude limiting amplifier 18 is connected to the signal output terminal 12 and the LO input terminal of the mixer 14.

Next, an explanation will be presented below as for the operation in the case where an input signal of a frequency $f_i$ is input from the signal input terminal 10 and where an output signal of a frequency $f_o$ is output from the amplitude limiting amplifier 18. The input signal usually contains amplitude-modulated-frequency components.

First, the input signal input is input to the RF input terminal of the mixer 14 via the signal input terminal 10. An output signal (of a frequency $f_o$) from the amplitude limiting amplifier 18 is input to the LO input terminal of the mixer 14. The mixer 14 produces the sum frequency component (of a frequency $(f_i+f_o)$) of the input signal and the output signal as well as the difference frequency component (of a frequency $(f_i-f_o)$) between of the input signal and the output signal.

Next, both the sum frequency component and the difference frequency component are input to the bandpass filter 16. The bandpass filter 16 has a filtering characteristic which blocks the sum frequency component but passes the difference frequency component. The bandpass filter outputs the difference frequency component (of a frequency $(f_i-f_o)$) of the two frequency components.

Next, the amplitude limiting amplifier 18 receives the difference frequency component and then outputs an output signal in which the amplitude-modulated frequency components have been removed. The frequency $f_o$ of the output signal from the amplitude limiting amplifier 18 is equalized to the frequency $(f_i-f_o)$ of the difference frequency component input to the limiting amplifier 18, that is, $f_o=f_i/2$. Hence, this circuit operates as a synthesized oscillation circuit which produces an output signal having half of the frequency of the input signal via the signal output terminal 12.

Hence, the maximum operational frequency required by the amplitude limiting amplifier 18 can be set to half of the frequency of the input signal. As a result, the limit of the maximum operational frequency can be relieved. Using an amplitude limiting amplifier having the same maximum operational frequency as that of the conventional amplitude limiting amplifier, it is possible to double the maximum operational frequency of the input signal which has been conventionally used. Moreover, where an input signal of the same frequency as that used conventionally is input, an amplitude limiting amplifier which has an operational frequency that is half of that of the input signal can serve sufficiently. Hence, even a low-performance amplitude limiting amplifier is serviceable.

A frequency multiplier (DBL) and a voltage-controlled oscillator (VCO) are not used for the synthesized oscillation circuit according to the present embodiment. This feature enables the circuit configuration to be simplified, and no electric power is needed for a VCO. Hence, the electric power consumed by the whole synthesized oscillation circuit can be reduced.

In the embodiments described above, only the examples where this invention is embodied under specific conditions have been explained. However, this invention can be embodied in many variations and modifications.

An amplitude limiting amplifier (LIM) is used in the above-mentioned embodiment. However, in the present invention, the amplitude limiting amplifier can be preferably formed of an amplitude limiter and an amplifier which are arranged respectively.

In the first embodiment, a bandpass filer (BPF) acting as a first filter is used. However, for example, a low-pass filter can be used as the first filter.

In the second embodiment, a bandpass filter (BPF) is used. However, a low-pass filter (LPF) can be used.

According to the synthesized oscillation circuit of the present invention, the difference frequency component between the frequency component of an input signal and the frequency component of an output signal is input to the amplitude limiting amplifier. This frequency component corresponds to half of the frequency of an input signal in a steady state. For that reason, the limit of the maximum operational frequency of a circuit restricted by the amplitude limiting amplifier can be relaxed.

According to the first aspect of the present invention, the synthesized oscillation circuit can oscillate in a synthesizing mode without using any frequency multiplier, thus losing no electric power due to a frequency multiplier. As a result, the electric power required for the output signal of the voltage-controlled oscillator can be reduced in comparison with the case where a frequency multiplier is used. Thus, the total electric power consumed by the synthesized oscillation circuit can be decreased.

According to the second aspect of the present invention, the synthesized oscillation circuit can oscillate in a synthesizing mode without using a frequency multiplier and a voltage-controlled oscillator. This feature allows the circuit configuration to be simplified and electric power for a voltage controlled oscillator to be neglected. Hence, the electric power consumed by the whole tuned oscillation circuit can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A synthesized oscillation circuit comprising:
   a signal input terminal;
   a signal output terminal;
   a mixer having an RF terminal, an IF terminal, and an LO terminal, said signal input terminal being connected to said RF terminal of said mixer;
   a first filter having input and output terminals, said IF terminal of said mixer being connected to said input terminal of said first filter;
   an amplitude limiting amplifier having input and output terminals, said output terminal of said first filter being connected to said input terminal of said amplitude limiting amplifier;
   a phase detector having first and second input terminals and an output terminal, said output terminal of said amplitude limiting amplifier being connected to said first input terminal of said phase detector;
   a second filter having input and output terminals, said output terminal of said phase detector being connected to said input terminal of said second filter; and
   a voltage-controlled oscillator having input and output terminals, said output terminal of said second filter being connected to said input terminal of said voltage-controlled oscillator, said output terminal of said voltage-controlled oscillator being connected to said signal output terminal, said LO terminal of said mixer, and said second input terminal of said phase detector,
   wherein said first filter has a filtering characteristic which blocks the sum frequency component of the frequency component of a signal from said signal input terminal to said mixer and the frequency component of a signal from said voltage-controlled oscillator to said mixer but passes the difference component between them, and
   wherein said second filter has a filtering characteristic which blocks the sum frequency component of the frequency component of a signal from said amplitude limiting amplifier to said phase detector and the frequency component of a signal from said voltage-controlled oscillator to said phase detector but passes the difference component between them.

2. The synthesized oscillation circuit as claimed in claim 1, wherein said first filter is a bandpass filter; and wherein said second filter is a low-pass filter.

3. The synthesized oscillation circuit as claimed in claim 1, wherein said first filter is a low-pass filter.

4. A synthesized oscillation circuit comprising:
   a signal input terminal;
   a signal output terminal;
   a mixer having an RF terminal, an IF terminal, and an LO terminal, said signal input terminal being connected to said RF terminal of said mixer;
   a first filter having input and output terminals, said IF terminal of said mixer being connected to said input terminal of said first filter;
   an amplitude limiting amplifier having input and output terminals, said output terminal of said first filter being connected to said input terminal of said amplitude limiting amplifier;
   a phase detector having first and second input terminals and an output terminal, said output terminal of said amplitude limiting amplifier being connected to said first input terminal of said phase detector;
   a second filter having input and output terminals, said output terminal of said phase detector being connected to said input terminal of said second filter;
   a voltage-controlled oscillator having input and output terminals, said output terminal of said voltage-controlled oscillator being connected to said signal output terminal, said LO terminal of said mixer, and said second other input terminal of said phase detector; and
   a voltage amplifier connected between said output terminal of said second filter and said input terminal of said voltage controlled oscillator,
   wherein said first filter has a filtering characteristic which blocks the sum frequency component of the frequency component of a signal from said signal input terminal to said mixer and the frequency component of a signal from said voltage-controlled oscillator to said mixer but passes the difference component between them, and
   wherein said second filter has a filtering characteristic which blocks the sum frequency component of the frequency component of a signal from said amplitude limiting amplifier to said phase detector and the frequency component of a signal from said voltage-controlled oscillator to said phase detector but passes the difference component between them.

5. A synthesized oscillation circuit comprising:

a signal input terminal;

a signal output terminal;

a mixer having first and second input terminals and an output terminal, said signal input terminal being connected to said first input terminal of said mixer;

a filter having input and output terminals, said output terminal of said mixer being connected to said input terminal of said filter;

an amplitude limiting amplifier having input and output terminals, said output terminal of said filter being connected to said input terminal of said amplitude limiting amplifier, said output terminal of said amplitude limiting amplifier being connected to said signal output terminal and said second input terminal of said mixer, wherein said filter has a filtering characteristic which blocks the sum frequency component of the frequency component of a signal from said signal input terminal to said mixer and the frequency component of a signal from said amplitude limiting amplifier to said mixer but passes the difference frequency component between them.

6. The synthesized oscillation circuit as claimed in claim 5, wherein said filter comprises a bandpass filter or a low-pass filter.

7. A synthesized oscillation circuit comprising:

a signal input terminal;

a signal output terminal;

a mixer having first and second input terminals and an output terminal, said signal input terminal being connected to said first input terminal of said mixer;

a filter having input and output terminals, said output terminal of said phase detector being connected to said input terminal of said filter;

an amplitude limiting amplifier having input and output terminals, said output terminal of said amplitude limiting amplifier being connected to said signal output terminal and said second input terminal of said mixer; and a voltage amplifier connected between said output terminal of said filter and said input terminal of said amplitude limiting amplifier, wherein said filter has a filtering characteristic which blocks the sum frequency component of the frequency component of a signal from said signal input terminal to said mixer and the frequency component of a signal from said amplitude limiting amplifier to said mixer but passes the difference frequency component between them.

8. A synthesized oscillation circuit comprising:

first means for producing a first difference signal between an input signal and a reference signal;

an amplitude limiting amplifier coupled to the first means;

second means, coupled to the amplitude limiting amplifier, for producing a second difference signal between an output signal from the amplitude limiting amplifier and the reference signal;

a voltage controlled oscillator, coupled to the second means, for producing an output signal; and a feedback loop for applying the output signal to the first and second means as the reference signal.

9. The synthesized oscillation circuit as claimed in claim 8, wherein the first means comprises a mixer having input terminals which receive the input and reference signals, the mixer additionally having an output terminal for supplying a mixer output signal, and means for filtering the mixer output signal.

10. The synthesized oscillation circuit as claimed in claim 9, wherein the first means further comprises a voltage amplifier coupled between the means for filtering and the amplitude limiting amplifier.

11. The synthesized oscillation circuit as claimed in claim 8, wherein the second means comprises a phase detector having input terminals which receive the output signal from the amplitude limiting amplifier and the reference signal, the phase detector additionally having an output terminal for supplying a phase detector output signal, and means for filtering the phase detector output signal.

12. A synthesized oscillation circuit comprising:

first means for receiving an input signal and a reference signal, and for generating from them a first multi-frequency signal having sum and difference components;

second means for filtering the first multi-frequency signal to pass one of the sum and difference components thereof as a selected component;

third means for generating a limited-amplitude signal from the selected component;

fourth means for receiving the limited-amplitude signal and the reference signal, and for generating from them a second multi-frequency signal having sum and difference components;

fifth means for filtering the second multi-frequency signal to pass one of the sum and difference components thereof as a selected component;

a voltage controlled oscillator which receives the selected component of the fifth means and which generates an output signal in response thereto, the output signal having a frequency that is a predetermined fraction of the frequency of the input signal; and feedback means for supplying the reference signal to the first and fourth means in response to the output signal.

13. A synthesized oscillation circuit comprising:

a mixer for receiving an input signal and a reference signal, and for producing from the input and reference signals a first sum signal and a first difference signal;

a first filter, coupled to the mixer, for blocking the first sum signal and passing the first difference signal;

an amplitude limiting amplifier coupled to the first filter;

a phase detector for receiving the reference signal and an output signal from the amplitude limiting amplifier, and for producing from them a second sum signal and a second difference signal;

a second filter, coupled to the phase detector, for blocking the second sum signal and passing the second difference signal;

a voltage controlled oscillator, coupled to the second filter, for producing an output signal; and a feedback loop for applying the output signal to the mixer and the phase detector as the reference signal.

14. A synthesized oscillation circuit comprising:

means for producing a difference signal between an input signal and a reference signal;

an amplitude limiting amplifier, coupled to the means, for producing an output signal; and a feedback loop for applying the output signal to the means as the reference signal.

15. The synthesized oscillation circuit as claimed in claim 14, wherein the means for producing comprises a mixer having input terminals which receive the input and reference signals, the mixer additionally having an output terminal for supplying a mixer output signal, and means for filtering the mixer output signal.

16. The synthesized oscillation circuit as claimed in claim 15, wherein the means for producing further comprises a voltage amplifier coupled between the means for filtering and the amplitude limiting amplifier.

17. A synthesized oscillation circuit comprising:

means for receiving an input signal and a reference signal, and for generating from them a multi-frequency signal having sum and difference components;

means for filtering the multi-frequency signal to pass one of the sum and difference components thereof as a selected component;

means for generating a limited-amplitude output signal from the selected component, the output signal having a frequency that is a predetermined fraction of the frequency of the input signal; and feedback means for supplying the reference signal to the means for receiving in response to the output signal.

18. A synthesized oscillation circuit comprising:

a mixer for receiving an input signal and a reference signal, and for producing a sum signal and a difference signal from the input and reference signals;

a filter, coupled to the mixer, for blocking the sum signal and passing the difference signal;

an amplitude limiting amplifier, coupled to the filter, for producing an output signal; and a feedback loop for applying the output signal to the mixer as the reference signal.

\* \* \* \* \*